United States Patent
Chow et al.

(10) Patent No.: US 8,097,869 B2
(45) Date of Patent: Jan. 17, 2012

(54) DIVERSITY PROXIMITY COMMUNICATION

(75) Inventors: Alex Chow, East Palo Alto, CA (US); R. David Hopkins, Hayward, CA (US); Robert J. Drost, Los Altos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 925 days.

(21) Appl. No.: 12/115,772

(22) Filed: May 6, 2008

(65) Prior Publication Data

US 2009/0279571 A1    Nov. 12, 2009

(51) Int. Cl.
   *G02B 27/00*    (2006.01)
   *H04B 10/00*    (2006.01)

(52) U.S. Cl. .......................... 250/551; 398/130

(58) Field of Classification Search .............. 250/214 R, 250/551; 398/130, 131; 257/777
See application file for complete search history.

(56) References Cited

U.S. PATENT DOCUMENTS 5,030,004 A * 7/1991 Grant et al. .................... 356/153
5,848,214 A * 12/1998 Haas et al. ..................... 385/120

* cited by examiner

*Primary Examiner* — Thanh X Luu
(74) *Attorney, Agent, or Firm* — Park, Vaughan, Fleming & Dowler LLP

(57) ABSTRACT

A diversity proximity communication system formed on two juxtaposed chips, one having a two-dimensional array of transmit elements, the other having a two-dimensional array of receive elements. The receive and transmit elements need not be aligned and may have nominal alignment of one transmit element overlapping the corners of four receive elements. The elements may be electrical pads capacitively coupled across the interface. Signals of four different multiplexing groups, e.g., time-multiplexed, are supplied to transmitting elements in a 2×2 array. Signals from four receive elements in a 2×2 array are amplified, combined, and demultiplexed for the selected multiplexing group. The gains for the four signals to be combined are differentially controlled to increase the signal-to-noise ratio. The amplification may be determined by the overlap between each of the receive elements and the transmit element of the selected multiplexing group.

18 Claims, 9 Drawing Sheets

US 8,097,869 B2

DIVERSITY PROXIMITY COMMUNICATION

BACKGROUND

1. Field

The present invention relates to techniques for communicating between integrated circuits. More specifically, the present invention relates to a method and an apparatus for using capacitively coupled communication techniques to communicate between stacked assemblies of laminated integrated circuit (IC) chips.

2. Related Art

Proximity Communication is a technology that promotes improved input/output (I/O) and allows face-to-face chips to communicate without wires. Drost et al. describe the basic technology in "Proximity Communication," *IEEE Journal of Solid-State Circuits*, vol. 39, pp. 1529-1535 (September 2004). Although it promises much higher I/O density and lower power than conventional I/O techniques, it requires accurate mechanical alignment between the communicating chips. The lamination may be accomplished by bonding together the two juxtaposed chips or fixing them together with a mechanical jig. Mechanical misalignment degrades performance by reducing signal and augmenting crosstalk noise; if the chips are sufficiently misaligned, noise may dominate the desired signal, and communication may fail.

In one implementation of Proximity Communication, mechanical misalignment is mitigated using electronic alignment correction through data steering. In this technique, as illustrated in FIG. 1, an array of large receive (Rx) pads 10 incorporated in an Rx chip overlies a larger array of small transmit (Tx) micropads 12 in a Tx chip. One Rx pad 10 is intended to overlap a two-dimensional array of smaller Tx micropads 12. However, when the chips are assembled into a laminated structure, the Rx pads 10 may not be not completely aligned with the Tx micropads 12. Each Tx pad 10 consists of a small array of the smaller micropads 12 in approximate correspondence to a respective Rx pad 10, and all of the micropads 12 in the small array couple the same signal to one Rx 10 pad on the Rx chip. Data steering adjusts the spatial placement of data on the sending Tx chip, depending on the relative position of the receiving Rx chip and its Rx pads 10. A switching fabric in the transmit array steers data to a set of selected Tx micropads 12' (here illustrated as sixteen in number) that provides optimal overlap with the respective receiving pad 12. Only those selected micropads 12' are powered. The Tx micropads 12 that are determined not to be closely associated with a receiving pad 10 are not powered. The data steering compensates for actual mechanical misalignment of the chips and allows dynamic alignment correction during operation.

However, the data steering circuitry is complex and costly in power. For a partitioning of one Tx macropad into N×N micropads, the cost in gates and power scales as $N^2$. For a 10×10 array (N=10), with 3×3 µm micropads implemented in a 180 nm technology, the cost in transmit power is about 60× that required to drive signals without electronic alignment correction but with similar speed performance. One can use a much more coarsely partitioned 4×4 array (N=4) to reduce power, but in this case crosstalk noise can remove up to ⅓ of the signal, and the cost in transmit power is still 11×. Power consumed in the Tx array is typically about 75% of the total power in the proximity communication interface. Therefore, eliminating the need for electronic alignment correction can provide significant power savings. Further, the technology requires alignment between the two chips to be less than the size of the smaller Tx micropads.

Thus, an alternate means is desirable for mitigating misalignment which consumes lower power and significantly reduces crosstalk noise compared to electronic alignment correction through data-steering.

SUMMARY

Some embodiments of the present invention provide a system allowing diverse proximity communication between transmitting and receiving elements on two chips in which the elements are not necessarily well aligned between the chips. The elements are arranged in two-dimension arrays on both chips with the same pitches.

The elements may be electrical pads forming capacitive coupling circuits between the chips. Alternatively, they may be inductors forming inductive coupling circuits, conductive connectors, or optical transmitters or receivers.

The transmit signals are divided into four multiplexing groups, which groups may be based on time, frequency, or code. Signals of different multiplexing groups are applied to the four transmitting elements forming a 2-by-2 array in the transmit array.

Signals received on four receiving elements forming a 2-by-2 array in the receive array are combined, preferably including demultiplexing.

The demultiplexing may be performed by time-gated amplifiers between the receiving elements and the combiners or by demultiplexers receiving the outputs of the combiners.

The four signals being combined may be differentially amplified to increase the signal-to-noise ratio. For example, the gains may be scaled according to the overlap between different ones of the receiving elements and the transmitting element of the selected multiplexing group.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Figure 1:
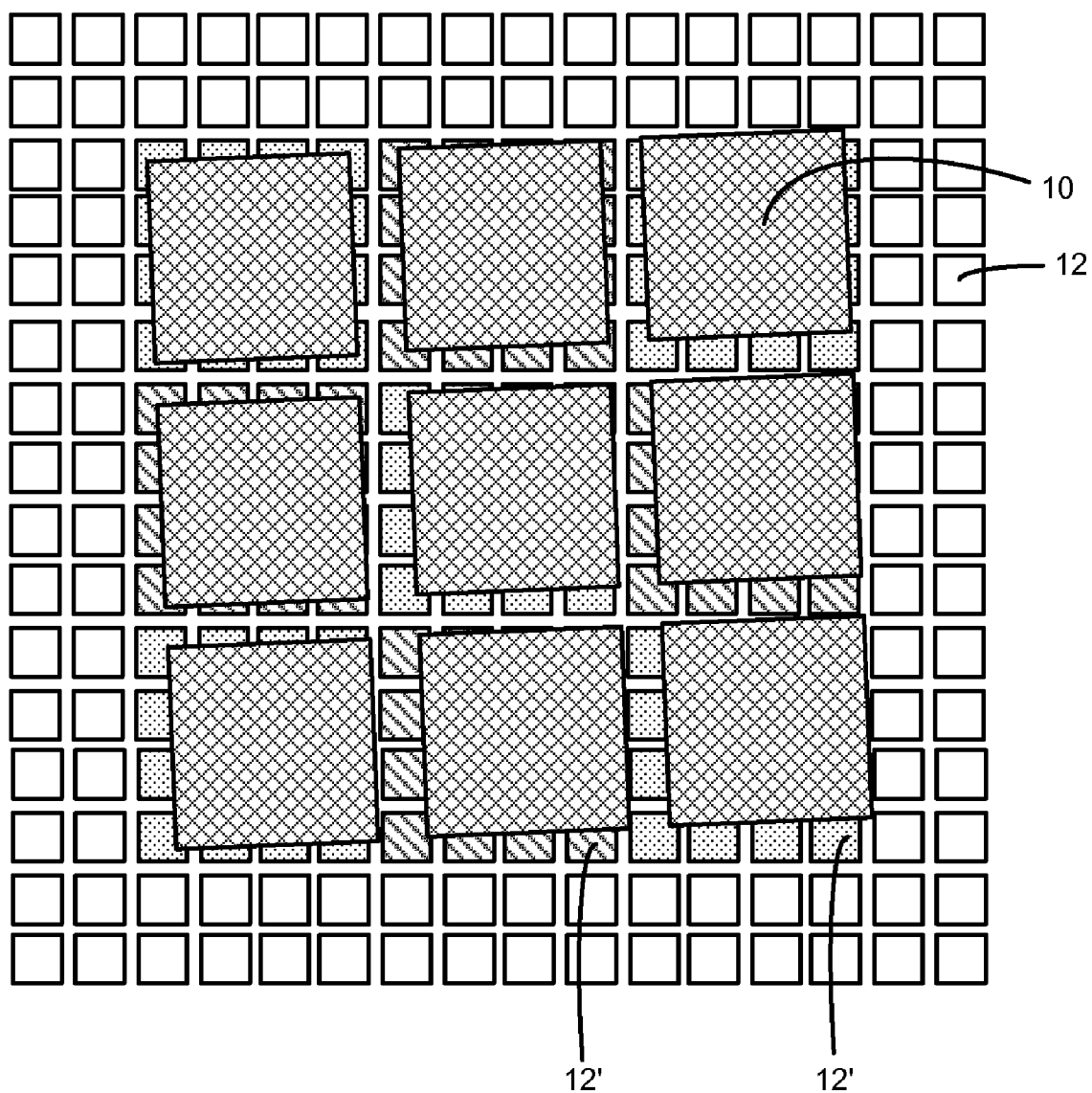
FIG. 1 is a schematic plan view of conventional data steering in proximity communication.
Figure 2:
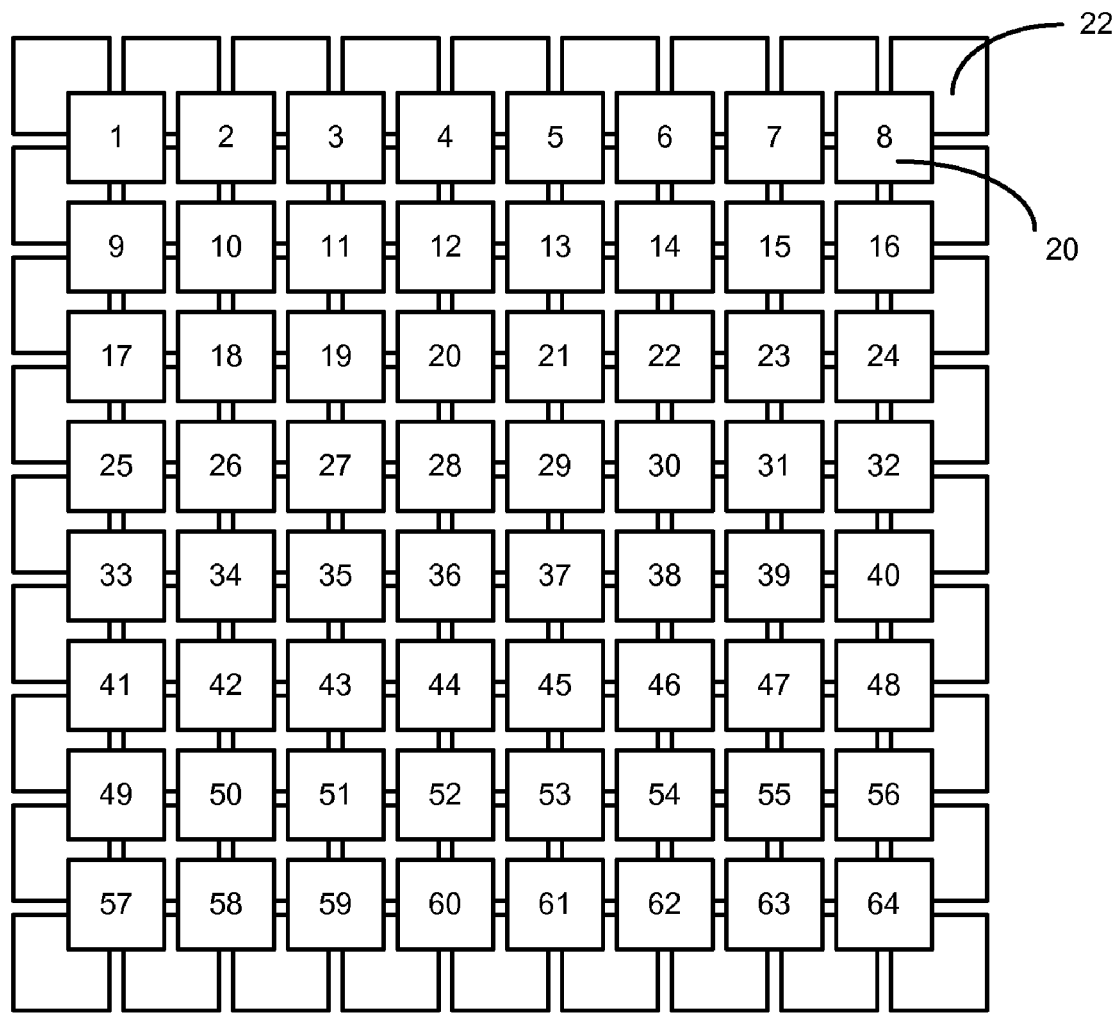
FIG. 2 is a plan view of nominal chip alignment of transmit and receive pads in diversity proximity communication in accordance with an embodiment of the present invention.

FIG. 2 shows the basic structure in one embodiment of the invention for implementing diversity proximity communication at nominal chip alignment. This exemplary structure consists of 64 Tx pads 20 in one chip and 81 Rx pads 22 in another chip. The two chips are juxtaposed so that capacitive coupling circuits are formed between the Tx and Rx pads 20, 22. In this embodiment, the Tx pads 20 and the Rx pads 22 are of the generally same shape and size and are arranged on the same pitches in two directions. In the nominal chip alignment of this embodiment, each Tx pad 20 overlies the corners of four Rx pads 22 and vice versa. Each channel is driven onto a separate Tx pad. The structure therefore supports a total of 64 channels. In general for a square array, to support N channels requires N Tx pads 20 and $(\sqrt{N}+1)^2$ Rx pads 22. However, the invention addresses the fact that the chips are not necessarily completely aligned when assembled so that the Tx pads 20 may fall out of nominal alignment with the Rx pads 22 with possibly both rectilinear and angular misalignment.

Figure 3:
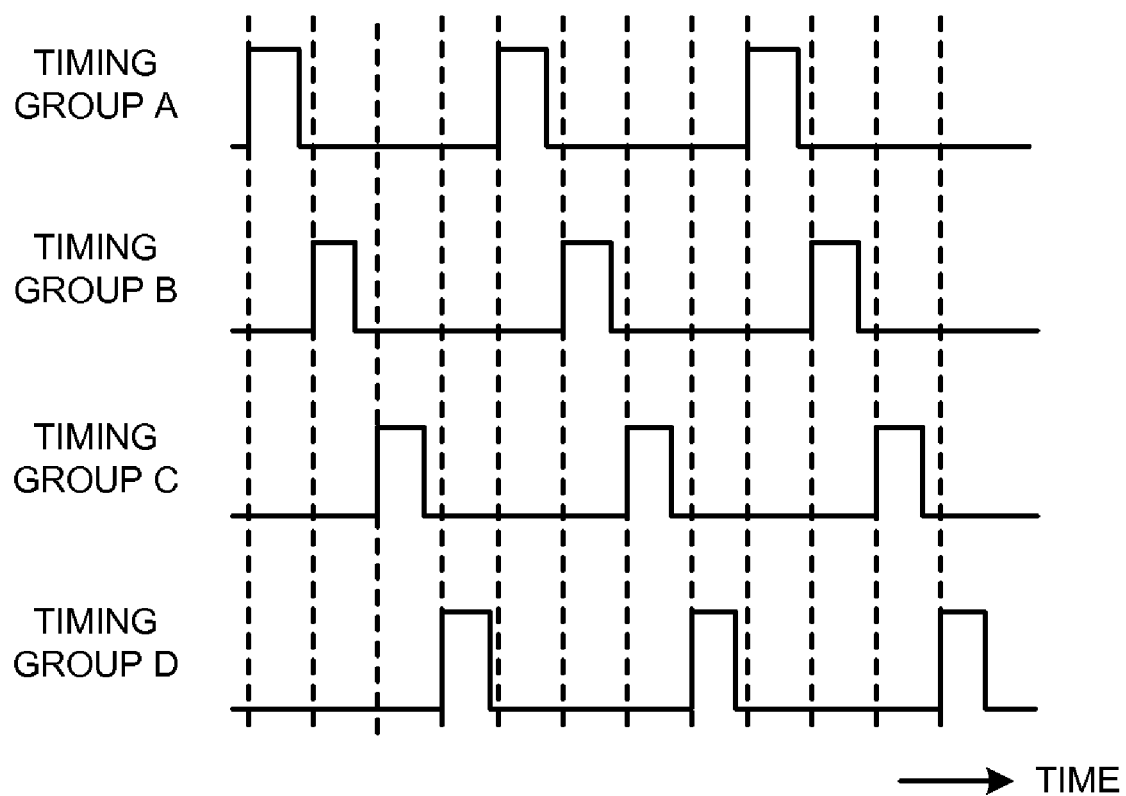
FIG. 3 is a timing diagram for interleaving four channels in diversity proximity communication in accordance with an embodiment of the present invention.

The structure shown in FIG. 2 resembles that of an ordinary proximity communication channel without data steering in which one Rx pad confronts one Tx pad. However, the transmitting and receiving mechanisms are very different. In the first set of embodiments, data channels are separated into four timing groups A, B, C, and D illustrated in the timing chart of FIG. 3. The four timing groups are associated with respective ones of four Tx pads 20 arranged in a repetitive 2×2 array superimposed on the Tx array of FIG. 2. For example, the Tx pads 20 labeled 1, 2, 9, and 10 carry the respective timing groups A, B, C, and D with the same spatial relationships transferred by two pads horizontally and vertically to the remaining Tx pads 20 of the array. The four timing groups are four-way time-interleaved or time-division multiplexed, such that signals in only one group transition at any given time. Note that for any degree of planar misalignment, each Tx pad 20 overlaps at most four Rx pads 22. Likewise, each Rx pad 22 receives signals directly from at most four Tx pads 20, each bearing a different time-multiplexed signal. Therefore, since only one of the four overlapped Tx pads 20 transitions at any given time, each receiving channel will see negligible crosstalk, even in the presence of misalignment between the two chips. If angular misalignment is expected, it is also possible to stagger rows or columns of the array to minimize cross talk. It is understood that the proximity communication may be bi-directional so that a single chip may include different arrays of Tx pads 10 and Rx pads 22, but the Tx and Rx arrays need to be spaced farther apart than any possible misalignment.

Figure 4:
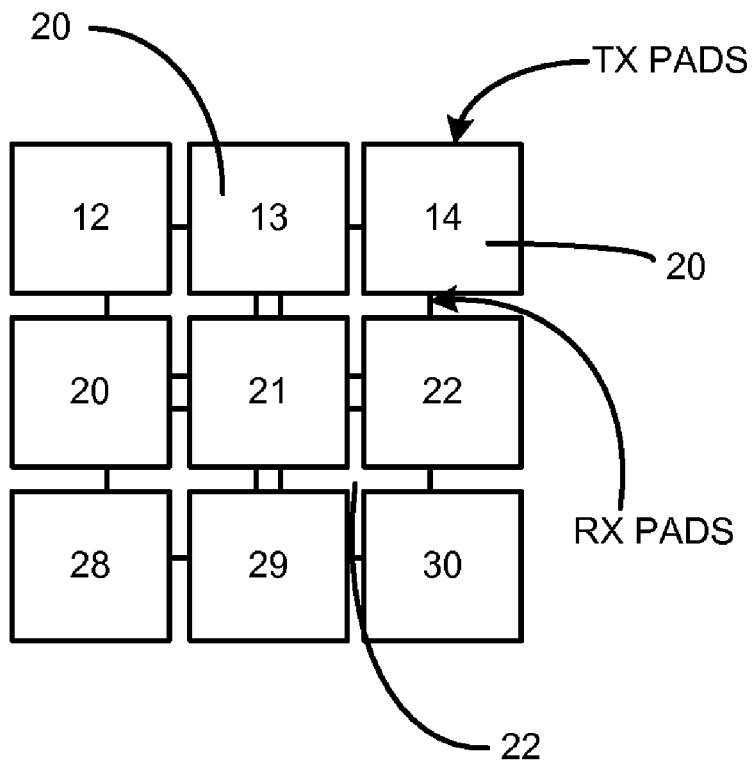
FIG. 4 is a plan view of the nominal overlap of transmitting and receiving pads.
Figure 5:
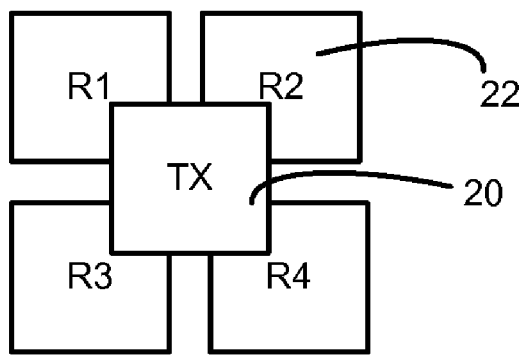
FIG. 5 is a simplified plan view of a functional unit in FIG. 4.
Figure 6:
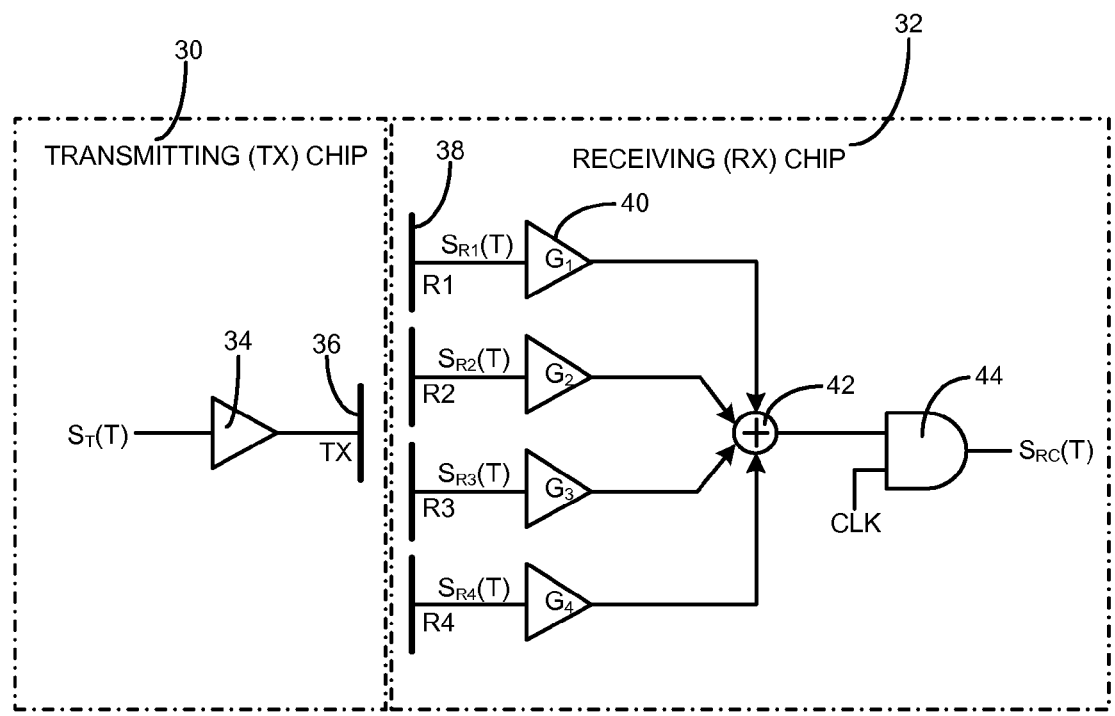
FIG. 6 is a circuit diagram of the functional unit of FIG. 5.

To determine the topology of a single channel, consider the Tx and Rx circuits of one channel. For example, the schematic plan view of FIG. 4 shows the Tx pad 20 in the center carrying channel 21. The figure also shows the eight Tx pads 20 adjacent to the channel-21 Tx pad 20 but carrying other channels and the Rx pads 22 overlapped by the channel-21 Tx pad 20. Because of the previously described division of timing groups between the Tx pads 20, for the Tx pad 20 of each Tx channel, each of its eight nearest neighboring Tx pads 20 belongs to a different timing group. Therefore, these eight neighbors may be neglected as shown in the simplified plan view of FIG. 5 for one timing group, for example, associated with channel 21 of FIG. 4. The corresponding circuit model is illustrated in FIG. 6, in which the Rx pad arrangement is flattened to a one-dimensional view. Because one Tx pad 20 can overlap with at most four Rx pads 22, each channel consists of one Tx path on a Tx chip 30 and four Rx paths on an Rx chip 32. Each of the four Rx paths will be called a branch.

For each channel, as illustrated in the circuit diagram of FIG. 6, the transmitting circuit consists of a driver 34 which applies a signal $s_T(t)$ onto one Tx pad 36. This transmitted signal is capacitively coupled to up to four Rx pads 38 respectively labeled $R_i$, $1 \leq i \leq 4$, for the i-th branch. Due to potential misalignment between the two chips, the signals $S_{Ri}(t)$ on the four Rx pads 38 may have different amplitudes. A receiver 40 with a gain of $G_i$, selected for that i-th Rx branch amplifies the signal on that branch. A combiner 42 sums the four amplified branch signals into a total received signal $S_{RC}(t)$ given as $$S_{RC}(t) = \sum_{i=1}^{4} G_i \cdot S_{Ri}(t) = \sum_{i=1}^{4} G_i \cdot A_i(t) \cdot S_T(t),$$

where $A_i$ represents the attenuation of the signal from capacitive division across the proximity I/O interface. The attenuation $A_i$ may be different for each branch due to misalignment between the two chips. A demultiplexer 44 may be used to extract the signal $S_{RC}(t)$ of the desired timing group from the other timing groups but time-gated receivers 40 may alternatively perform the extraction. A simple time demultiplexer is an AND or NAND gate receiving the data signal on one input and one of four timing or clock signals on the other input.

The choice of the branch gain $G_i$ depends on the mechanical alignment between the chips, and in general it may be different for each branch. For example, if the alignment is such that the Tx pad 20 in FIG. 5 completely overlaps the Rx pad R1, then a large value can be selected for $G_1$ and small or zero values for $G_2$, $G_3$ and $G_4$. In general, the branch gains should be chosen to maximize the signal-to-noise ratio (SNR) of the combined signal $S_{RC}(t)$. The next section will discuss different combining schemes that provide quantitative formulations for the choice of the branch gains $G_i$.

Figure 7:
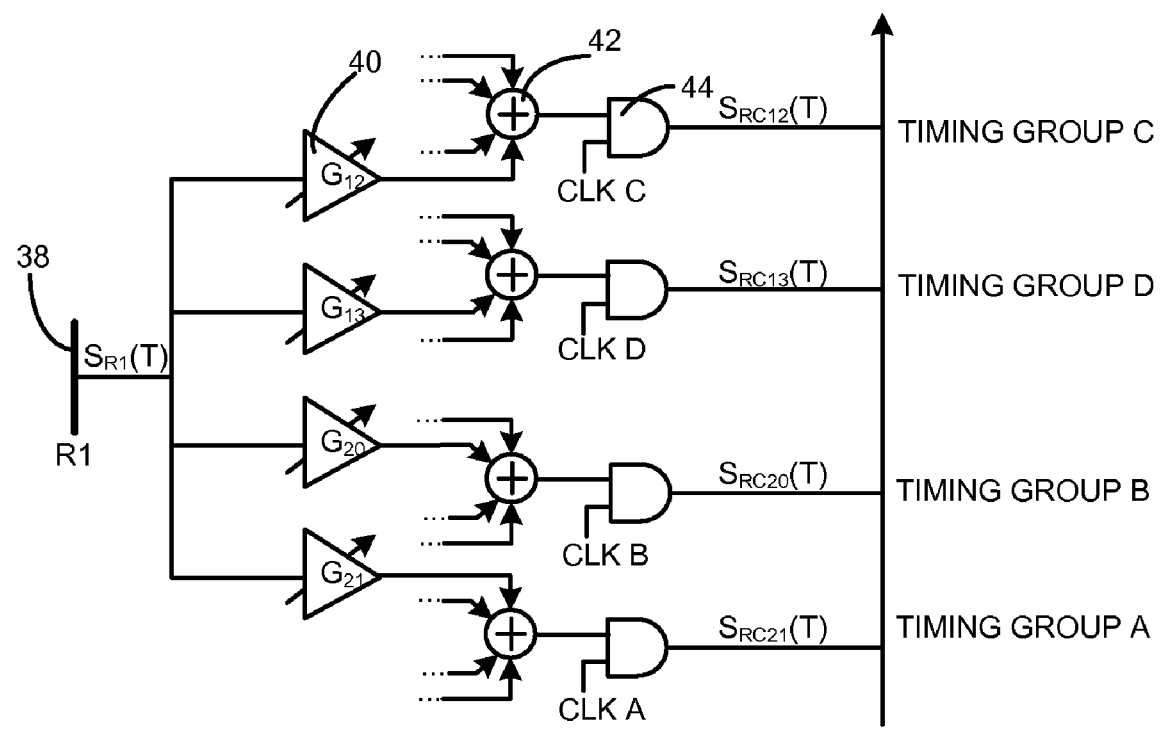
FIG. 7 is a circuit diagram of one embodiment of the four receiving channels on one receive pad.

A determination of the complete topology of a branch requires further consideration. The circuit definition of FIG. 6 is not complete because each Rx pad couples to four different channels. For example, pad R1 in FIG. 4 couples to Tx channels 12, 13, 20, and 21 on the respectively labeled Tx pads 20 of FIG. 4. Therefore, each Rx pad 22 is actually connected to four receivers 40, one for each channel, as shown in the circuit diagram of FIG. 7. The four receivers 40 receiving signals from the same Rx pad 38 belong to four different timing groups, and therefore there is no crosstalk interference among them. This requirement applies to time interleaving but not to frequency multiplexing or code-division multiplexing. The amplified signal from the active receiver 40 is then summed in the combiner 42 with those from the other three diversity receivers for the same channel. Note that in this configuration, the Rx pad 38 sees higher capacitance because four receivers 40 are connected to it. The loading reduces the coupled signal on the Rx pad 38. Alternatively to the gated amplifiers 40, each channel may include its respective demultiplexer 44 to extract the respective one of the four timing groups.

The four timing groups can maintain their own data streams. Alternatively, as illustrated, the outputs can be combined or multiplexed into a single data stream. If their outputs are combined, the AND gates should be tri-state. In similar fashion, the signals input on the transmitting side may be demultiplexed into the four time-divided data streams from a single input stream.

In proximity communication, opposing channels may be formed between the two chips. That is, each of the juxtaposed chips may include Tx pads with associated transmitters and Rx pads with associated receivers so information can be transmitted in both directions. In view of the loose alignment allowed by the invention, the pad arrays of the transmitting and receiving elements on one chip should be widely separated so they will not overlap with the wrong type of elements on the other chip. Also, some of the communication channels may be passive and not require transmitters or receivers on the adjoined chips.

Figure 8:
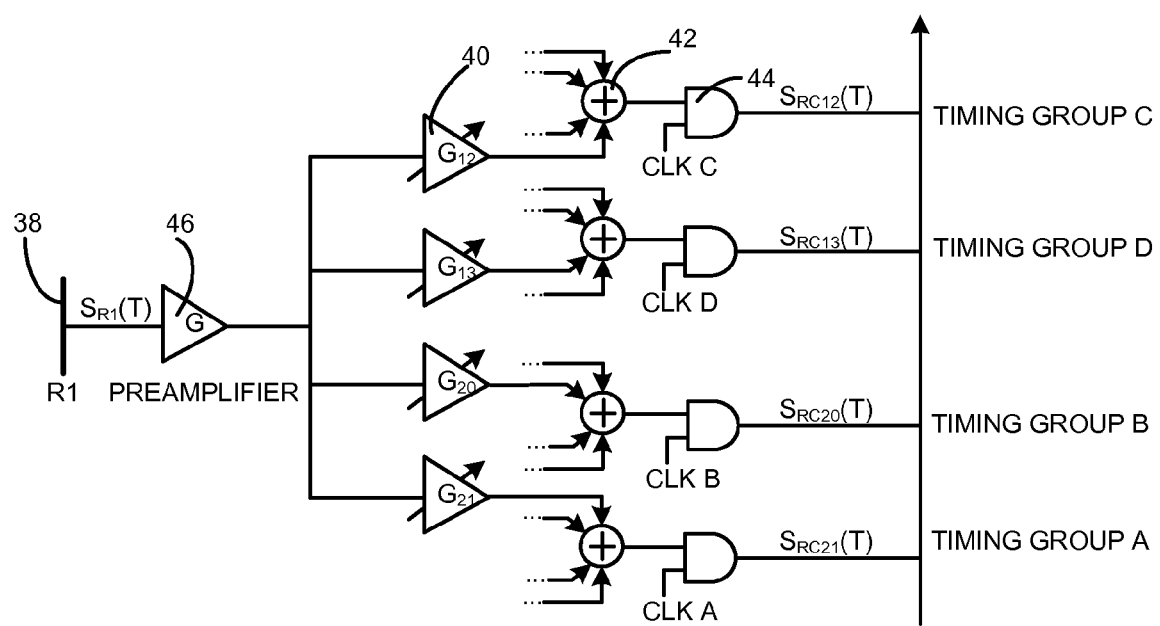
FIG. 8 is a circuit diagram of an alternative to the circuit diagram of FIG. 7 additionally including a pre-amplifier.

In an alternate configuration illustrated in the circuit diagram of FIG. 8, a preamplifier 46 with a fixed gain G first amplifies the received signal. The amplified signal is then fed to all four diversity receivers 40. The preamplifier 46 isolates the receiver pad 38 from the loading at the fork into the four receivers 40.

Figure 9:
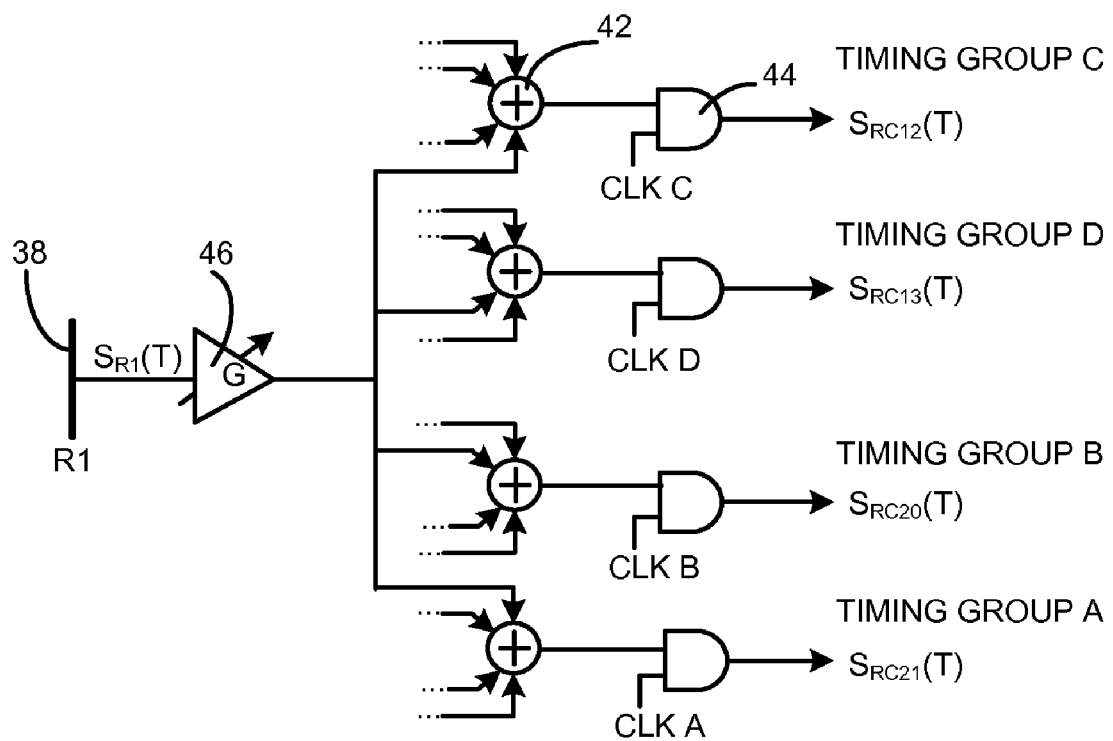
FIG. 9 is a circuit diagram of another embodiment of the four receiving channels on one receive pad including a common time-multiplexed receiver for the four channels.

In another embodiment of a receiver branch configuration shown in the circuit diagram of FIG. 9, one amplifier 46 detects the signals for all channels and distributes the amplified signal to all four combiners 42. This receiving amplifier 46 therefore belongs to all timing groups and is active on every transition. The gain of the amplifier 46 must also be adjusted on every quarter-cycle for every channel. Although this configuration reduces the load capacitance on the Rx pad 38, it imposes stricter timing constraints on the initial receiver 46 or the separated timing of FIG. 3.

The amplifier gains of the multiple diversity receivers (or timed amplifiers) receiving the same signal should be chosen to optimize performance of the combined signal. In general, the diversity gains should be chosen to maximize the signal-to-noise ratio (SNR) of the combined signal from all four diversity branches. This requires knowledge of the SNR of each individual diversity branch relative to the SNR of the other branches, as will be discussed next.

Figure 10:
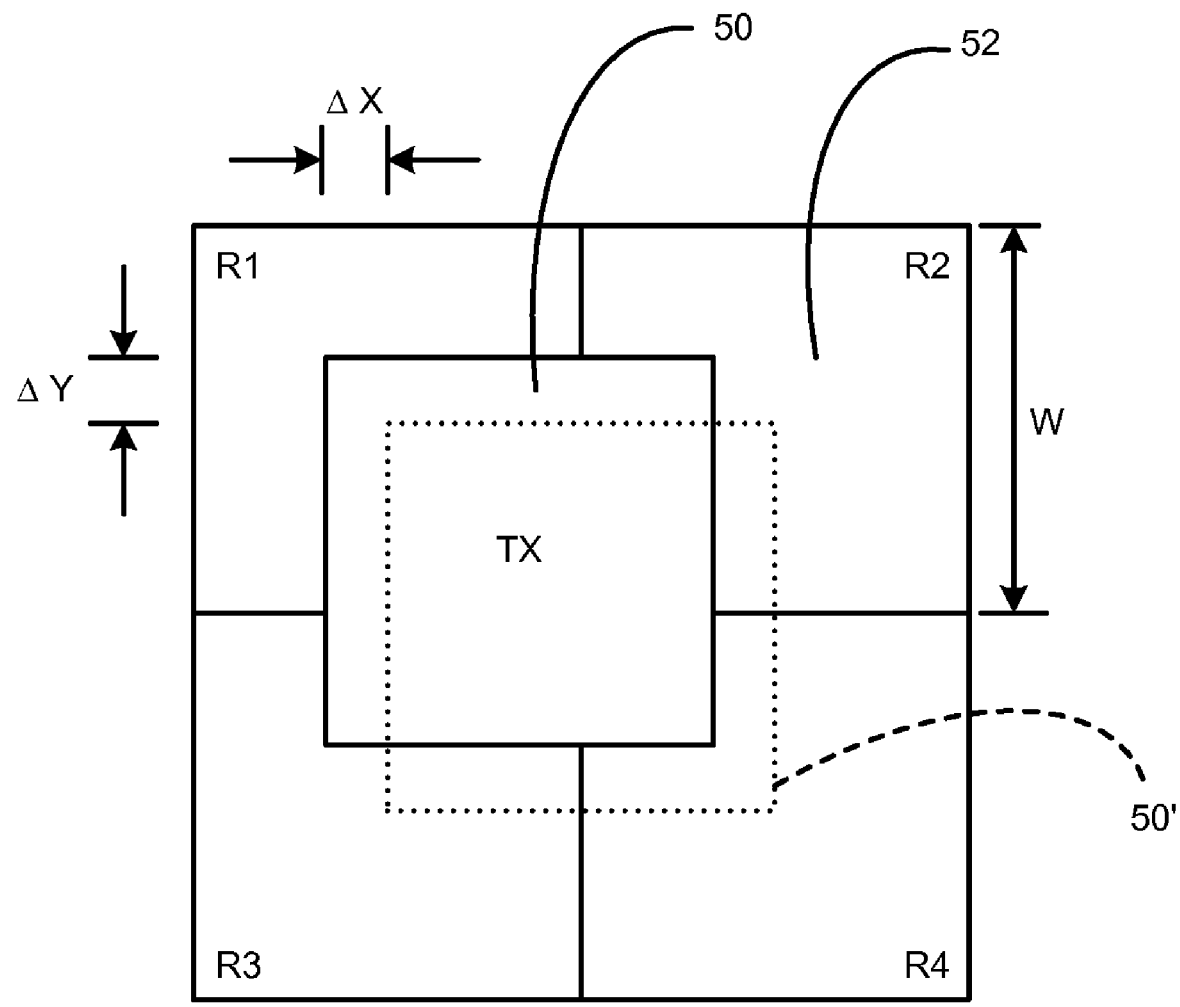
FIG. 10 is a plan view of one transmit pad and the four receive pads to which it is coupled with a degree of rectilinear misalignment.

The plan view of FIG. 10 illustrates the pad arrangement for one diversity channel with misaligned pads. A transmit pad 50 is mechanically misaligned from its nominal position 50', indicated by dotted lines relative to four underlying receive pads 52. Angular misalignment is not considered in this analysis because it tends to have less effect under normal aligning procedures. Nonetheless, angular misalignment can be compensated with obvious extensions to the formulas. The misalignment is quantized as $\Delta x$ in the x-direction and $\Delta y$ in the y-direction. This analysis assumes that all Tx and Rx pads are squares with a lateral dimension w. For simplicity, the separation between adjacent pads is ignored. It is also assumed that the signal coupling area is the overlap area between the Tx pad 50 and the respective Rx pad 52. In practice, however, fringe coupling increases the actual signal coupling area, but the presented formulations can be easily extended to include these effects. The overlap areas $A_i$ between the Tx pad 50 and each Rx pad 52, designated by $R_i$, $1 \leq i \leq 4$, are given by $$A_1 = \frac{w^2}{4} + \frac{w}{2}(\Delta x + \Delta y) + \Delta x \cdot \Delta y$$

$$A_2 = \frac{w^2}{4} + \frac{w}{2}(\Delta y - \Delta x) - \Delta x \cdot \Delta y$$

$$A_3 = \frac{w^2}{4} + \frac{w}{2}(\Delta x - \Delta y) - \Delta x \cdot \Delta y$$

$$A_4 = \frac{w^2}{4} - \frac{w}{2}(\Delta x + \Delta y) + \Delta x \cdot \Delta y.$$

Let us define normalized misalignment parameters $$dx = \frac{\Delta x}{w} \text{ and } dy = \frac{\Delta y}{w}.$$

If it is assumed that the noise power is similar in each diversity branch, which is a valid assumption since most noise originates from the receivers, then the coupled area of each branch relative to the nominal coupled area $$A_0 = \frac{w^2}{4}$$

gives the signal-to-noise ratio $\gamma_i$ for each branch i relative to the nominal SNR $\gamma_0$. We define the SNR simply as $$\gamma = \frac{s^2}{N},$$

where s is the signal amplitude, that is, voltage level, and N is the average noise power or noise spectral density. For a real data signal, the actual signal power may be some fraction of $s^2$, depending on the signal shape and activity factor. The relative SNR of each branch is therefore given by $$\frac{\gamma_1}{\gamma_0} = \frac{A_1}{A_0} = 1 + 2(dx + dy) + 4dx \cdot dy$$

$$\frac{\gamma_2}{\gamma_0} = \frac{A_2}{A_0} = 1 + 2(dy - dx) - 4dx \cdot dy$$

$$\frac{\gamma_3}{\gamma_0} = \frac{A_3}{A_0} = 1 + 2(dx - dy) - 4dx \cdot dy$$

$$\frac{\gamma_4}{\gamma_0} = \frac{A_4}{A_0} = 1 - 2(dx + dy) + 4dx \cdot dy.$$

The simplest combining scheme is to choose the branch gains $G_i$ such that only the branch with the highest SNR is used. For example, if the misalignment is as illustrated in FIG. 10, the SNR is highest in branch 1 associated with R1. We therefore choose a finite value for $G_1$ and $G_2 = G_3 = G_4 = 0$. The SNR of the combined signal is then the maximum of the individual branch SNRs.

The technique is simple but non-optimal. In particular, the case where dx=dy=0, the SNR is only 25% of the maximum achievable SNR when the Tx pad completely overlaps any one of the four branch pads.

Reception can be improved with maximal-ratio combining (MRC), in which the branch gains are selected to maximize the SNR of the combined signal $\gamma_{MRC}$. If each branch i has a gain of $G_i$, then the signal amplitude of the combined signal is $$s_{MRC} = \sum_{i=1}^{4} G_i s_i,$$

where $s_i$ represents the input amplitude of the signal on pad $R_i$. Assume that each branch has the same average input noise power N and that the noise sources are uncorrelated. This assumption is valid if non-deterministic noise dominates the total noise power. Also note that N represents the equivalent input-referred noise power of the receiver, which encompasses all noise sources along the receiver channel. The total combined noise power is $$N_{MRC} = N \sum_{i=1}^{4} G_i^2.$$

Note that the total noise power is taken as the sum of all branch powers because it is assumed that branch noise is mostly uncorrelated. On the other hand, total signal is taken as the sum of all branch signals because the branch signals are correlated. The combined SNR is therefore $$\gamma_{MRC} = \frac{s_{MRC}^2}{N_{MRC}} = \frac{\left(\sum_{i=1}^{4} G_i s_i\right)^2}{N \sum_{i=1}^{4} G_i^2}.$$

The Cauchy-Schwarz inequality stipulates that $$\left(\sum_i x_i y_i\right)^2 \leq \left(\sum_i x_i^2\right)\left(\sum_i y_i^2\right)$$

and equality is achieved when $$\frac{x_1}{y_1} = \frac{x_2}{y_2} = \ldots = \frac{x_i}{y_i}.$$

Combining the last three equations provides an upper bound and hence maximum achievable combined SNR of $$\gamma_{MRC} \leq \frac{\left(\sum_{i=1}^{4} G_i^2\right)\left(\sum_{i=1}^{4} s_i^2\right)}{N \sum_{i=1}^{4} G_i^2} = \sum_{i=1}^{4} \frac{s_i^2}{N} = \sum_{i=1}^{4} \gamma_i.$$

In other words, the maximum combined SNR is simply the sum of the SNRs of all four branches. This is achieved when $x_i = y_i$ for all i, that is, when every branch gain $G_i$ is chosen to be $$G_i = \frac{s_i}{N}.$$

In general, the combined SNR is maximized when each branch gain $G_i$ is chosen to be proportional to the input amplitude. This result is convenient because it means that the branch gain can be adjusted by simply monitoring the input amplitude into the same branch over a number of cycles to reduce the effect of noise on the gain. Alternatively, the branch gain can be computed by first measuring chip misalignment, and then determining the relative signal amplitudes using the measured values of dx and dy in the above equations. Errors in the computed gain can be tolerated as they would prevent maximizing SNR but would still achieve some portion of that maximum SNR.

With maximal-ratio diversity, the SNR of the combined signal is simply the sum of the SNR of all branches. As a result, regardless of the actual mechanical misalignment between two chips, the maximum SNR is always equivalent to that when the chips are perfectly aligned. This result arises because the sum of the signal coupling areas of all branches always equals the pad area for any degree of alignment.

In its most general form, the concept of diversity is used to improve the received signal-to-noise ratio (SNR). The above description demonstrates how to exploit diversity to compensate for mechanical misalignment, but in general the improvement in SNR offered by diversity is orthogonal to the problem of misalignment. Diversity can be used to increase the SNR of any proximity I/O channel, as long as some of the noise is uncorrelated to the signal.

With electronic alignment correction of the prior art, the degree of crosstalk noise rejection depends on the granularity of the Tx micropad array. In order to achieve a high level of noise rejection, it is necessary to use a very finely partitioned micropad array. For example, using a coarsely partitioned 4×4 micropad arrangement, crosstalk noise can remove up to ⅓ of the signal. On the other hand, diversity allows the level of noise rejection to be determined by the precision to which the amplifier gain can be controlled. By using appropriate circuit techniques, it is not difficult to achieve fine-tunable amplifier gain; therefore, it is possible to achieve fine-grain noise rejection without an excessive amount of circuitry for steering and multiplexing.

As noted above, the transmitter steering circuitry required for conventional electronic alignment correction is very costly in complexity and power, especially if we need to reject a high level of crosstalk noise. Diversity allows very fine-grain noise rejection to be achieved with significantly less circuitry. The reduced circuitry arises because the degree of noise rejection depends on the precision of the amplifier gain, not the number of receiver branches.

The above description presents a method of implementing diversity over capacitively coupled proximity communication. It is possible to apply the same principles to other electromagnetic coupling techniques, including inductively coupled and optically coupled links. It is also possible to extend the invention to implement current-mode conductive communication links.

Thus far, the described embodiments have separated all channels into four timing groups, where channels are four-way time-interleaved such that only signals in one timing group transition at any given time. The signals are therefore multiplexed in time. It is also possible to multiplex signals using different frequencies (frequency multiplexing) or spreading codes (code division multiplexing), as disclosed by Chow et al. in U.S. patent application Ser. No. 11/971,492, filed Jan. 9, 2008. For frequency multiplexing, the demultiplexer may be implemented as a band of frequency filters. For code division multiplexing, the demultiplexer may be implemented as a correlator correlating the signal with different codes.

The implementation described above can compensate for mechanical misalignment of up to one pad pitch. The correction range can be extended by permuting the data bits at a higher level. This allows an arbitrary number of full pad shifts, and achieves a much larger correction range, at the expense of additional circuit complexity. This circuit complexity is less than that for conventional electronic alignment correction using micropads because the transmitter pads are not as numerous.

Thus, diversity enables very fine-grain noise rejection with significantly less circuitry. This advantage arises because the degree of noise rejection depends on the precision of the amplifier gain, not the number of receiver branches.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A diversity communication system, comprising:
   a first chip including a first plurality of transmitting elements arranged in a two-dimensional transmit array on two respective given pitches and a first plurality of transmitters supplying respective transmit signals to the transmitting elements; and
   a second chip juxtaposed to the first chip and including
      a second plurality of receiving elements arranged in a two-dimensional receive array on the two respective given pitches each coupled to at least one of the transmitting elements,
      a second plurality of receivers receiving signals from the receiving elements, and
      a plurality of combiners each receiving outputs from four of the receivers and combining them to form a combined signal from one of the transmitting elements.

2. The system of claim 1, wherein the transmitting and receiving elements are electrical pads forming capacitive coupling elements when the chips are juxtaposed.

3. The system of claim 1, wherein the transmit signals are divided into four multiplexing groups and the array of transmitting elements are arranged as an array of 2-by-2 arrays of transmitting elements, wherein each of the transmitting elements of each of the 2-by-2 arrays receives transmit signals of different ones of the multiplexing groups.

4. The system of claim 3, wherein the multiplexing groups are time-multiplexed groups.

5. The system of claim 3, wherein the multiplexing groups are frequency-multiplexed groups.

6. The system of claim 3, wherein the multiplexing groups are code-division-multiplexed groups.

7. The system of claim 1, wherein each of the receiving elements receives signals from between two and four of the transmit elements.

8. The system of claim 1, further comprising for each of the combiners in the plurality of combiners, four variable amplifiers coupled between different ones of the receiving elements and each combiner.

9. The system of claim 8, wherein the gains of different ones of the amplifiers are selected to maximize a signal-to-noise ratio of a combined signal produced by each combiner.

10. The system of claim 8, wherein the gains of different ones of the amplifiers are selected according to amounts of overlaps of the different ones of the receiving elements with a selected one of the transmitting elements.

11. A method of diverse proximity communication, comprising the steps of:
    juxtaposing a first chip including a first plurality of transmitting elements arranged in a two-dimensional transmit array on given rectilinear pitches and a second chip juxtaposed to the first chip and including a second plurality of receiving elements arranged in a two-dimensional receive array on the given rectilinear pitches and each coupled to at least one of the transmitting elements and a second plurality of receivers receiving signals from the receiving elements,
    applying input signals of four different multiplexing groups to respective transmitting elements arranged in a 2-by-2 array in the transmit array; and
    combining signals from four of the receiving elements arranged in a 2-by-2 array on the receive array to form a combined signal.

12. The method of claim 11, wherein the combining step forms the combined signal to belong to only one of the four multiplexing groups.

13. The method of claim 11, further comprising differentially amplifying the signals from the four of the receiving elements to increase a signal-to-noise ratio in the combined signal.

14. The method of claim 11, further comprising differentially amplifying the signals from the four of the receiving elements according to overlaps of different ones of the four of the receiving elements with a selected one of the transmitting elements.

15. The method of claim 14, further comprising forming the combined signal to belong to only one of the four multiplexing groups corresponding to the selected one of the transmitting elements.

16. The method of claim 11, wherein the four multiplexing groups are multiplexed according to time.

17. The method of claim 11, wherein the four multiplexing groups are multiplexed according to frequency.

18. The method of claim 11, wherein the four multiplexing groups are multiplexed according to code.

* * * * *